(12) United States Patent
Sadowsky

(10) Patent No.: US 7,071,855 B1
(45) Date of Patent: Jul. 4, 2006

(54) GRAY CODE CONVERSION METHOD AND APPARATUS EMBODYING THE SAME

(76) Inventor: Jonathan B. Sadowsky, 1650 Headslane Rd., West Sacramento, CA (US) 95691

( * ) Notice: Subject to any disclaimer, the term of this patent is extended or adjusted under 35 U.S.C. 154(b) by 0 days.

(21) Appl. No.: 11/020,997

(22) Filed: Dec. 23, 2004

(51) Int. Cl.
*H03M 7/04* (2006.01)
(52) U.S. Cl. .......................... 341/98; 341/97
(58) Field of Classification Search ............... 341/50, 341/97, 98, 159, 160; 711/217, 218
See application file for complete search history.

(56) References Cited

U.S. PATENT DOCUMENTS

| 6,703,950 | B1 * | 3/2004 | Yi ................................ 341/97 |
| 6,809,666 | B1 * | 10/2004 | Ewedemi et al. .............. 341/97 |
| 6,836,525 | B1 * | 12/2004 | Weng ........................... 377/34 |

OTHER PUBLICATIONS

Gray code, http://www.nist.gov/dads/HTML/graycode.html (1 and 2 of 2) Nov. 17, 2004 3:09:41 AM.
Q21: What are Gray codes, and why are they used?. http://www.cs.bham.ac.uk/Mirrors/ftp.de.uu.net/EC/clife/www/Q21.htm (1 through 4 of 4) Nov. 17, 2004 3:09:03 AM.
Gray code—Wikipedia, the free encyclopedia, http://en.wilkipedia.org/wiki/Gray_code (1 through 8 of 8) Nov. 17, 2004 2:57:01 AM.
Gray Code. http://mathworld.wolfram.com/GrayCode.html. 3 pages, no date.
Gray code algorithms in Ruby. http://yagni.com/graycode/. 5 pages, no date.

* cited by examiner

*Primary Examiner*—Brian Young

(57) ABSTRACT

A generalized Gray code converter includes a decimal-binary to intermediate-binary converter and an intermediate-binary to Gray code converter. The decimal-binary to intermediate-binary converter is operable to convert a sequence of sets of electrical signals encoded in decimal-binary format (decimal-binary sequence) to a sequence of sets of electrical signals encoded in intermediate-binary format (intermediate sequence). The intermediate-binary to Gray code converter, connected to the decimal-binary to intermediate-binary converter, is operable to convert the intermediate sequence to a sequence of sets of electrical signals encoded in Gray code-binary format (Gray code sequence).

15 Claims, 6 Drawing Sheets

GRAY CODE CONVERSION METHOD AND APPARATUS EMBODYING THE SAME

BACKGROUND

The present invention relates generally to method and system of communicating signals. More particularly, the present invention relates to method and system of communicating signal from one circuit domain to another clock domain using Gray code encoding.

Electrical signals representing useful information are often communication from one circuit domain to another circuit domain. For example, a set of electrical signals representing an address within a storage device is transmitted from a first circuit domain to a second circuit domain. For convenience, each electrical signal is referred to as a bit, and a set of bits is also referred to as a "data word" or "word." For some applications, the data word can be "wide." That is, the data word is a set of many bits, or electrical signals. For example, a data word having eight bits (eight bits wide) can be used, for example, to address up to 256 unique locations within a storage medium.

In practice, an incrementing sequence of data words is communication from the first circuit domain to the second circuit domain in quick succession, often thousands or millions of words per second. The data words are typically encoded in typical decimal based binary data format.

To improve reliability and speed of the communication of the data words from the first circuit domain to the second circuit domain, each data word (in decimal binary format) is converted to Gray code format before it is transmitted from the first circuit domain. At the second circuit domain, the received data word (in Gray code binary format) is converted back to decimal binary data format before it is further processed or used. For convenience, a data word in decimal base binary data format is refereed to as a "binary word," and data word in Gray code binary format is refereed to as a "Gray code word." Further, a sequence of binary words is referred to as "decimal-binary sequence" and a sequence of Gray code words is referred to as "Gray code sequence." A decimal-binary sequence has a finite number B of binary words (set of signals). Number B is also referred to as the number of "states" of the decimal-binary sequence. A corresponding Gray code sequence has the same number of states.

In a complete sequence of a decimal-binary sequence having binary words with width N, the value of B (the number of states of the decimal-binary sequence) is $2^N$. For example, TABLE 1 below lists a complete decimal-binary sequence of data words having 4 bits of width. That is, for the sample decimal-binary sequence, N is 4, and, thus, B is $2^4$ which is 16. The sample decimal-binary sequence has 16 states as indicated by State Index 0 to 15.

TABLE 1

| State Index | Decimal-Binary sequence | Corresponding Gray code sequence |
| --- | --- | --- |
| 0 | 0000 | 0000 |
| 1 | 0001 | 0001 |
| 2 | 0010 | 0011 |
| 3 | 0011 | 0010 |
| 4 | 0100 | 0110 |
| 5 | 0101 | 0111 |
| 6 | 0110 | 0101 |
| 7 | 0111 | 0100 |

TABLE 1-continued

| State Index | Decimal-Binary sequence | Corresponding Gray code sequence |
| --- | --- | --- |
| 8 | 1000 | 1100 |
| 9 | 1001 | 1101 |
| 10 | 1010 | 1111 |
| 11 | 1011 | 1110 |
| 12 | 1100 | 1010 |
| 13 | 1101 | 1011 |
| 14 | 1110 | 1001 |
| 15 | 1111 | 1000 |

Note that, for the sample decimal-binary sequence of TABLE 1, the corresponding Gray code sequence has a useful property that makes the Gray code value in many applications. The useful property is that, in the Gray code sequence, any two successive values differ in only one digit. This property is used in many communication applications to increase examine reliability of transmitted data.

There are two basic approaches for converting a decimal-binary sequence to a corresponding Gray code sequence. In the first approach, a conversion look-up table is used to convert each binary word of the decimal-binary sequence to its corresponding Gray code word. To implement this technique, the conversion look-up table is manually populated. That is, the conversion look-up table is created having an entry for each possible binary word and its corresponding Gray code word. Each entry of the conversion look-up table is manually coded and entered. For a large decimal-binary sequence (requiring a table having hundreds, thousands, or even more entries), this approach is difficult to perform, time consuming, requires high labor costs, and is error prone.

In the second approach, a known conversion algorithm is used to convert each binary word (in binary data format) to its corresponding binary word in Gray code format. Typically the conversion is performed on the fly; however, the conversion can be performed to populate a conversion look-up table. Several techniques for converting a decimal-binary sequence to Gray code sequence are known in the art. Once known technique for converting a decimal-binary sequence to Gray code sequence using software is reproduced below as a computer program.

The known conversion techniques are applicable only for decimal-binary sequence s having the number of states N is a power of two. That is, the known conversion techniques are applicable only for a decimal-binary sequence with N states where N is equal to $2^n$ where n is an integer. For example, N can be 2, 4, 8, 16, 32, etc. Further, the known conversion techniques also require that each successive binary word of the decimal-binary sequence be either incrementing or decrementing by one (1) from the previous binary word within the decimal-binary sequence. That is, the binary word at position i within the sequence is either greater than or less than the binary word at position i−1 by only one.

For a decimal-binary sequence having a number of states N that is not a power of two, known algorithms are not applicable, and a conversion look-up table needs to be manually coded. However, as already discussed, manual population of conversion look-up tables are often difficult to perform, time consuming, requires high labor costs, and is error prone.

Accordingly, there remains a need for improved method and system for converting decimal-binary sequence of signals to Gray code sequence of signals.

SUMMARY

The need is met by the present invention. In a first embodiment of the present invention, a generalized Gray code converter includes a decimal-binary to intermediate-binary converter and an intermediate-binary to Gray code converter. The decimal-binary to intermediate-binary converter is operable to convert a sequence of sets of electrical signals encoded in decimal-binary format (decimal-binary sequence) to a sequence of sets of electrical signals encoded in intermediate-binary format (intermediate sequence). The intermediate-binary to Gray code converter, connected to the decimal-binary to intermediate-binary converter, is operable to convert the intermediate sequence to a sequence of sets of electrical signals encoded in Gray code-binary format (Gray code sequence).

In a second embodiment of the present invention, a generalized Gray code de-converter includes a Gray code to intermediate-binary converter and an intermediate-binary to decimal-binary converter. The Gray code to intermediate-binary converter is operable to convert a sequence of sets of electrical signals encoded in Gray code binary format (Gray code sequence) to a sequence of sets of electrical signals encoded in intermediate-binary format (intermediate sequence). The intermediate-binary to decimal-binary converter, connected to the Gray code to intermediate-binary converter, is operable to convert the intermediate sequence to a sequence of sets of electrical signals encoded in decimal-binary format (decimal-binary sequence).

In a third embodiment of the present invention, a communication system including a first circuit domain is disclosed. The first circuit domain includes a generalized Gray code converter including a decimal-binary to intermediate-binary converter and an intermediate-binary to Gray code converter. The decimal-binary to intermediate-binary converter is operable to convert a sequence of sets of electrical signals encoded in decimal-binary format (decimal-binary sequence) to a sequence of sets of electrical signals encoded in intermediate-binary format (intermediate sequence). The intermediate-binary to Gray code converter, connected to the decimal-binary to intermediate-binary converter, is operable to convert the intermediate sequence to a sequence of sets of electrical signals encoded in Gray code-binary format (Gray code sequence).

In a fourth embodiment of the present invention, a method for communicating signals is disclosed. First, a sequence of sets of signals encoded in decimal-binary format (decimal-binary sequence) is converted into a sequence of sets of signals encoded in intermediate-binary format (intermediate sequence). Next, the intermediate sequence is converted into a sequence of sets of electrical signals encoded in Gray code-binary format (Gray code sequence). Then, the Gray code sequence is transmitted.

Other aspects and advantages of the present invention will become apparent from the following detailed description, taken in conjunction with the accompanying drawings, illustrating by way of example the principles of the invention.

DETAILED DESCRIPTION

The present invention will now be described with reference to the Figures which illustrate various embodiments of the present invention. In the Figures, some sizes of structures or portions may be exaggerated and not to scale relative to sizes of other structures or portions for illustrative purposes and, thus, are provided to illustrate the general structures of the present invention. Furthermore, various aspects of the present invention are described with reference to a structure or a portion positioned "on" or "above" relative to other structures, portions, or both. Relative terms and phrases such as, for example, "on" or "above" are used herein to describe one structure's or portion's relationship to another structure or portion as illustrated in the Figures. It will be understood that such relative terms are intended to encompass different orientations of the device in addition to the orientation depicted in the Figures. For example, if the device in the Figures is turned over, rotated, or both, the structure or the portion described as "on" or "above" other structures or portions would now be oriented "below," "under," "left of," "right of," "in front of," or "behind" the other structures or portions. References to a structure or a portion being formed "on" or "above" another structure or portion contemplate that additional structures or portions may intervene. References to a structure or a portion being formed on or above another structure or portion without an intervening structure or portion are described herein as being formed "directly on" or "directly above" the other structure or the other portion. Same reference number refers to the same elements throughout this document.

As shown in the Figures for the purposes of illustration, embodiments of the present invention are exemplified by a generalized Gray code converter includes a decimal-binary to intermediate-binary converter and an intermediate-binary to Gray code converter. The decimal-binary to intermediate-binary converter is operable to convert a sequence of sets of electrical signals encoded in decimal-binary format (decimal-binary sequence) to a sequence of sets of electrical signals encoded in intermediate-binary format (intermediate sequence). The intermediate-binary to Gray code converter, connected to the decimal-binary to intermediate-binary converter, is operable to convert the intermediate sequence to a sequence of sets of electrical signals encoded in Gray code-binary format (Gray code sequence).

In the present invention the decimal-binary sequence is converted to the intermediate sequence which is then converted to the Gray code sequence. Utilizing inventive conversion techniques, the decimal-binary sequence having any number of states (not limited to a number matching a power of 2) can be converted to a corresponding Gray code sequence. This overcomes the limitation of the prior art techniques and systems discussed above.

Communication System

Figure 1:
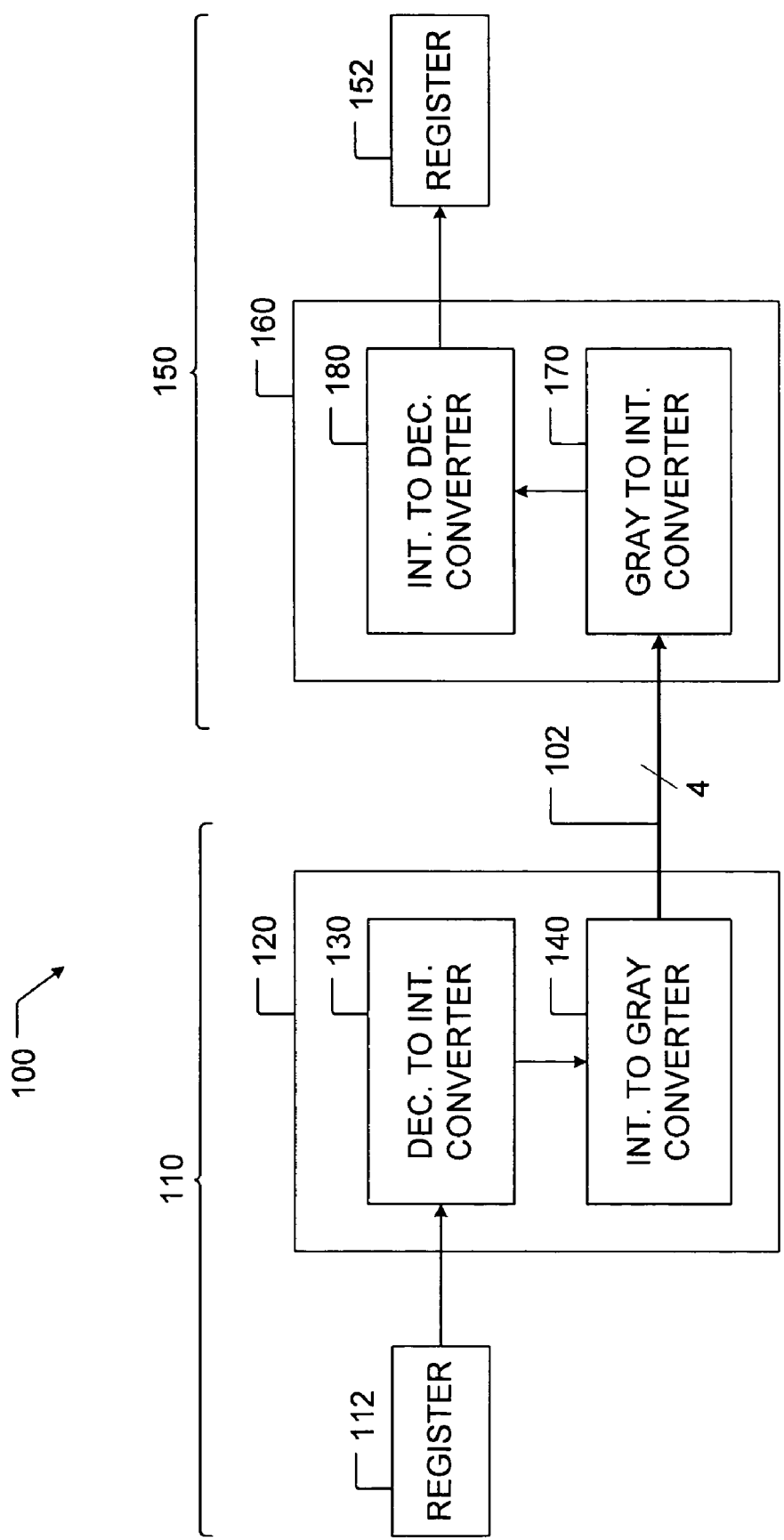
FIG. 1 illustrates a communication system according to one embodiment of the present invention.

FIG. 1 illustrates a communication system 100 having a first circuit domain 110 and a second circuit domain 150. Referring to FIG. 1, the first circuit domain 110 and the second circuit domain 150 communicates via a communications means 102 such as a communications bus or via wireless signals. A circuit domain is a group of circuits operating together to perform a function. In the present embodiment, the first circuit domain 110 includes circuits operable to transmit a sequence of sets of electrical signals while the second circuit domain 150 includes circuits operable to receive the transmitted signals. Often circuits of a circuit domain operate from a common synchronization clock; however, this is not a necessary aspect of the present invention.

In the illustrated embodiment, the first circuit domain 110 includes, for example, a register 112 operable to provide a pointer to a sequence of sets of electrical signals encoded in decimal-binary format (decimal-binary sequence). Alternatively, the register 112 provides the decimal-binary sequence.

The first circuit domain 110 includes a generalized Gray code converter 120. The generalized Gray code converter 120 includes a decimal-binary to intermediate-binary converter 130 and an intermediate-binary to Gray code converter 140. The intermediate-binary converter 130 is operable to convert a sequence of sets of electrical signals encoded in decimal-binary format (decimal-binary sequence) to a sequence of sets of electrical signals encoded in intermediate-binary format (intermediate sequence). For convenience, each electrical signal is referred to as a bit. A set of bits is also referred to as a "data word" or "word" as well as a set. For example, a set of eight bits is often referred to as a byte.

The intermediate-binary to Gray code converter 140 is connected to the decimal-binary to intermediate-binary converter 130. The intermediate-binary to Gray code converter 140 is operable to convert the intermediate sequence to a sequence of sets of electrical signals encoded in Gray code-binary format (Gray code sequence).

The Gray code sequence is transmitted from the first circuit domain 110 to the second circuit domain 150.

The second circuit domain 150 includes a generalized Gray code de-converter 160. The generalized Gray code de-converter 160 includes a Gray code to intermediate-binary converter 170 and an intermediate-binary to decimal-binary converter 180. The Gray code to intermediate-binary converter 170 is operable to convert the Gray code sequence to the intermediate sequence. The intermediate-binary to decimal-binary converter 180 is operable to convert the intermediate sequence to the decimal-binary sequence. The decimal-binary sequence is passed onto other components of the second circuit domain 150 such as a register 152 for further processing.

Operations

Sample Decimal-Binary Sequence

As already stated, the generalized Gray code converter 120, unlike the prior art Gray code converters, is operable to convert a decimal-binary sequence having any number of states. For example, TABLE 2 below lists words of a sample decimal-binary sequence having five states (indexed as states 0 through 4) where each word (set of signals) is expressible using three bits (signal lines). That is, for the sample decimal-binary sequence, the number of states, B, is 5 and word width n is 3. Because 5 is not an even number and is not a number that is a power of 2, a prior art Gray code converter cannot be used to convert the sample decimal-binary sequence to Gray code. Often, such sample decimal-binary sequence is repeatedly sent from a first circuit domain to the second circuit domain.

TABLE 2

| State Index | Sample Decimal-Binary sequence |
|---|---|
| 0 | 000 |
| 1 | 001 |
| 2 | 010 |
| 3 | 011 |
| 4 | 100 |

Figure 2:
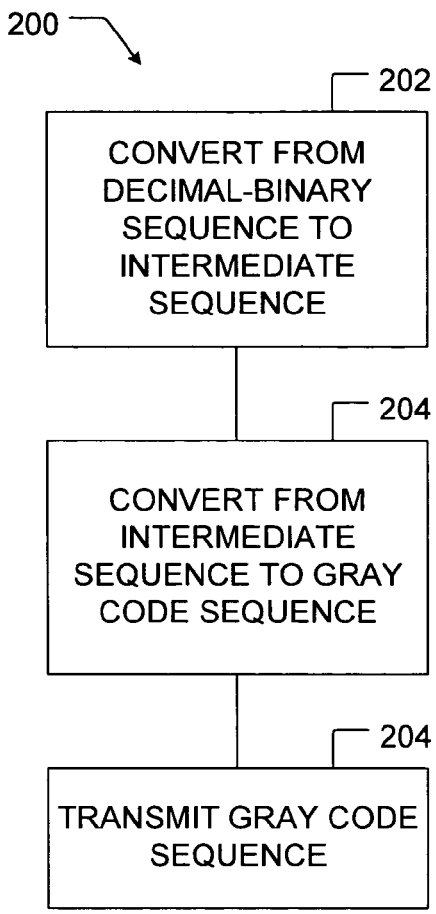
FIG. 2 is a flow chart illustrating one aspect of the present invention.

Operations of the generalized Gray code converter 120 can be explained utilizing flowchart 200 of FIG. 2. For example, assume the sample decimal-binary sequence of TABLE 2 is the sequence of sets of signals for communication from the first circuit domain 110 to the second circuit domain 150.

First, the decimal-binary sequence is converted to a sequence of sets of signals encoded in intermediate-binary format (intermediate sequence). Step 202. Next, the intermediate sequence is converted to a sequence of sets of electrical signals encoded in Gray code-binary format (Gray code sequence). Step 204. Then, the Gray code sequence is transmitted. Step 206.

Doubling the Decimal-Binary Sequence

Figure 3A:
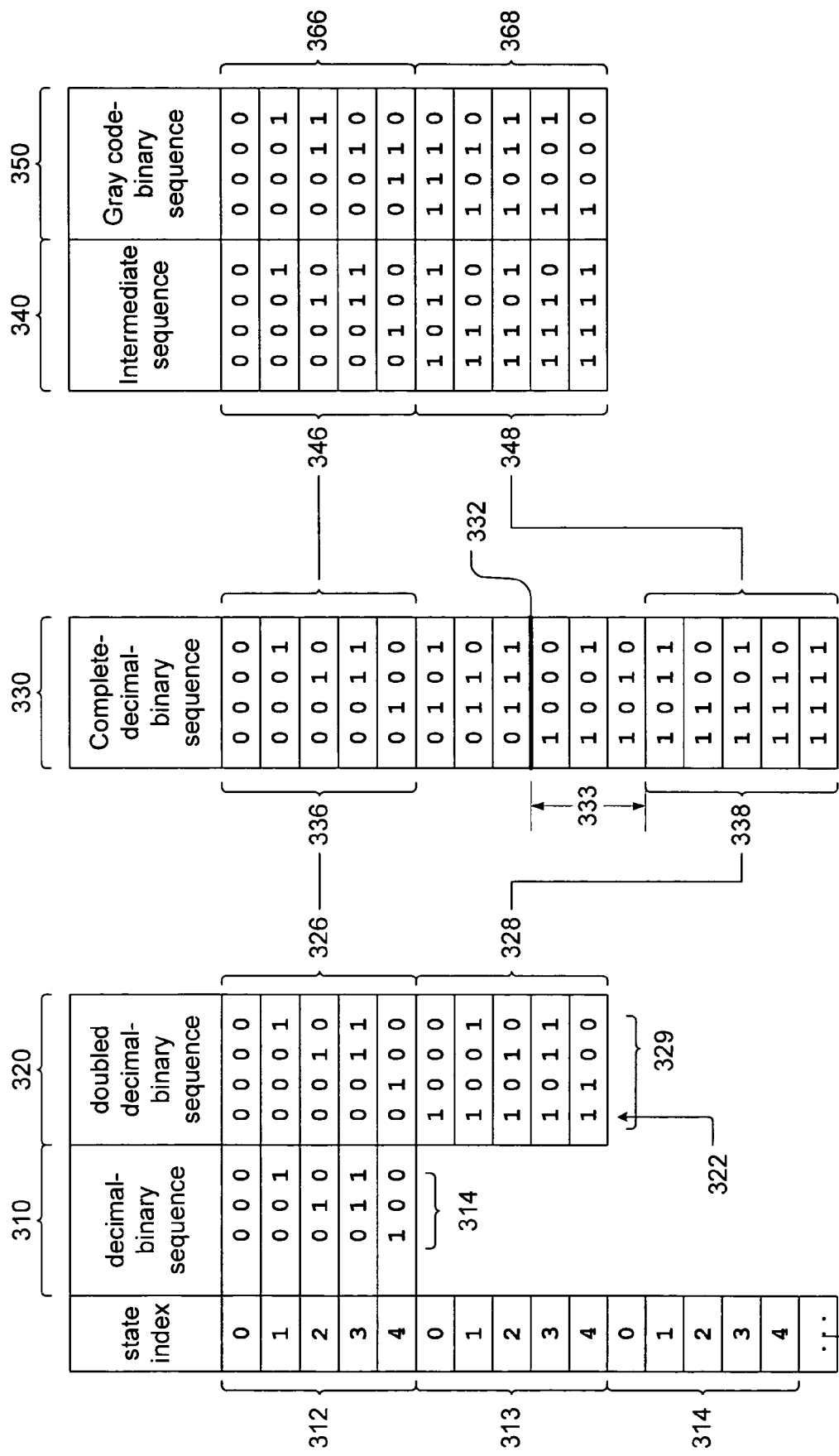
FIGS. 3A, 3B, and 4 illustrate various sequences of signals useful for discussing various aspects of the present invention.

FIG. 3A illustrates various sequences applicable for conversion of the decimal-binary sequence to the intermediate sequence. Referring to FIGS. 1 and 3A, the sample decimal-binary sequence is illustrated as column 310. This is same as the sample decimal-binary sequence of TABLE 2 above. As illustrated, the decimal-binary sequence 310 has five states (states 0 through 4) as indicated by reference numeral 312. Each state of the decimal-binary sequence 310 is represented by a data word (a set of binary signals) having 3 bits as indicated by reference numeral 314. The states of the decimal-binary sequence 310 are also referred to as sets of signals where B represents the number of sets, or states, which, in the present example, is 5. Each state, or set, in the present example, has n bits, which, in the present example, is 3.

In the illustrated embodiment, the decimal-binary sequence 310 is repeatedly communicated from the first circuit domain 110 to the second circuit domain 150. The repetition is indicated by repeated status indexes 313 and 314, and by an ellipse 315. However, to avoid clutter and possible confusion, only one sequence cycle of the decimal-binary sequence 310 and other sequences are illustrated in the Figures.

The decimal-binary to intermediate-binary converter 130 doubles the number of states of the decimal-binary sequence 310 resulting in a doubled decimal-binary sequence illustrated as column 320. The number of states of the decimal-binary sequence 310 is doubled by the following steps: first, adding, to each data word of the decimal-binary sequence 310, another bit (a most significant bit 322); then repeating the 3-bit data words of the decimal-binary sequence 310 once for the top half 326 of the doubled decimal-binary sequence 320 with the most significant bit 322 set at 0, then once for the bottom half 328 of the doubled decimal-binary sequence 320 (with the most significant bit 322 set at 1.

Mapping to Intermediate Sequence

The resulting doubled decimal-binary sequence 320 is a sequence of 4-bit words (indicated by reference number 329) and has twice the number of states as the decimal-binary sequence 310. The doubled decimal-binary sequence 320 includes a sequence of data words (set of signals), each word having width of N bits where N is n+1 where n is the number of bits of the words (set of signals) of the decimal-binary sequence 310.

Then, the doubled decimal-binary sequence 320 is mapped to a complete-decimal-binary sequence having base N (in the present example, base 4). The complete-decimal-binary sequence for 4-bit words is listed in TABLE 1 above and also illustrated as column 330 of FIG. 3A. In the present example, the complete-decimal-binary sequence 330 has 16 (or $2^4$) states (0 through 15).

The top half 326 of the doubled decimal-binary sequence 320 is mapped to top (first) entries 336 of the complete-decimal-binary sequence 330 as illustrated. The bottom half 328 of the doubled decimal-binary sequence 320 is mapped to bottom entries 338 of the complete-decimal-binary sequence 330 as illustrated, resulting in the intermediate sequence illustrated as column 340.

The mapping of the bottom half 328 of the doubled decimal-binary sequence 320 to the bottom entries 338 of the complete-decimal-binary sequence 330 is equivalent to mapping of the bottom half 328 of the doubled decimal-binary sequence 320 to the complete-decimal-binary sequence 330 beginning at its center reflection line 332 plus a shifting constant 333 (designated R) where the shift constant R 333 is determined as follows:

$$R=(2^N-2B)/2$$

where
N is the number of bits in a word (or set) of the doubled decimal-binary sequence (in the present example, N=4); and
B is the number of states of the decimal-binary sequence (in the present example, B=5).

Thus, in the present example, the shift constant R 333 has value three (3).

Equivalent Technique to Form the Intermediate Sequence

Figure 3B:
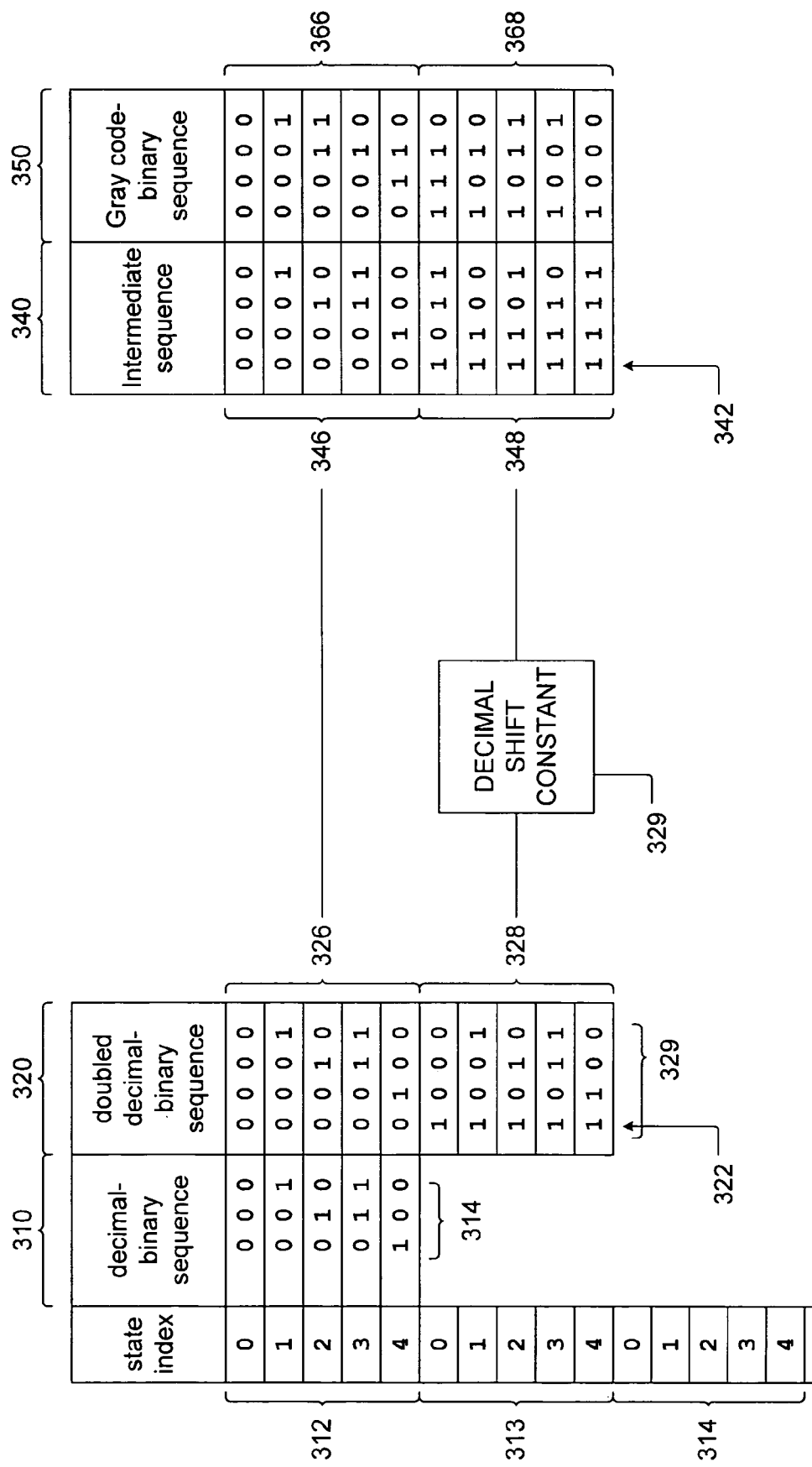

An alternative but an equivalent illustration of the mapping technique is illustrated in FIG. 3B. Referring to FIGS. 3A and 3B, since the top half 326 of the doubled decimal-binary sequence 320 is identical to top (first) entries 336 of the complete-decimal-binary sequence 330, no operation is actually performed to accomplish this mapping. That is, for the top half 326 of the doubled decimal-binary sequence 320, no operation is required to form the intermediate sequence 340.

Accordingly, the intermediate sequence 340 is formed by combining the top half 326 of the doubled decimal-binary sequence 320 and the bottom half 328 of the doubled decimal-binary sequence 320 shifted by the shift constant R 333. The shifting can be accomplished by merely adding, in decimal, the value of R (in the present example, R is 3) to each word of the bottom half 328 of the doubled decimal-binary sequence 320. The adding technique is illustrated by the adder 329.

Intermediate Sequence to Gray Code Sequence

Then the intermediate sequence 340 is converted to its corresponding Gray code binary sequence using a known Gray conversion technique. This Gray code binary sequence (corresponding to the intermediate sequence 340) is illustrated using reference numeral 350.

Figure 4:
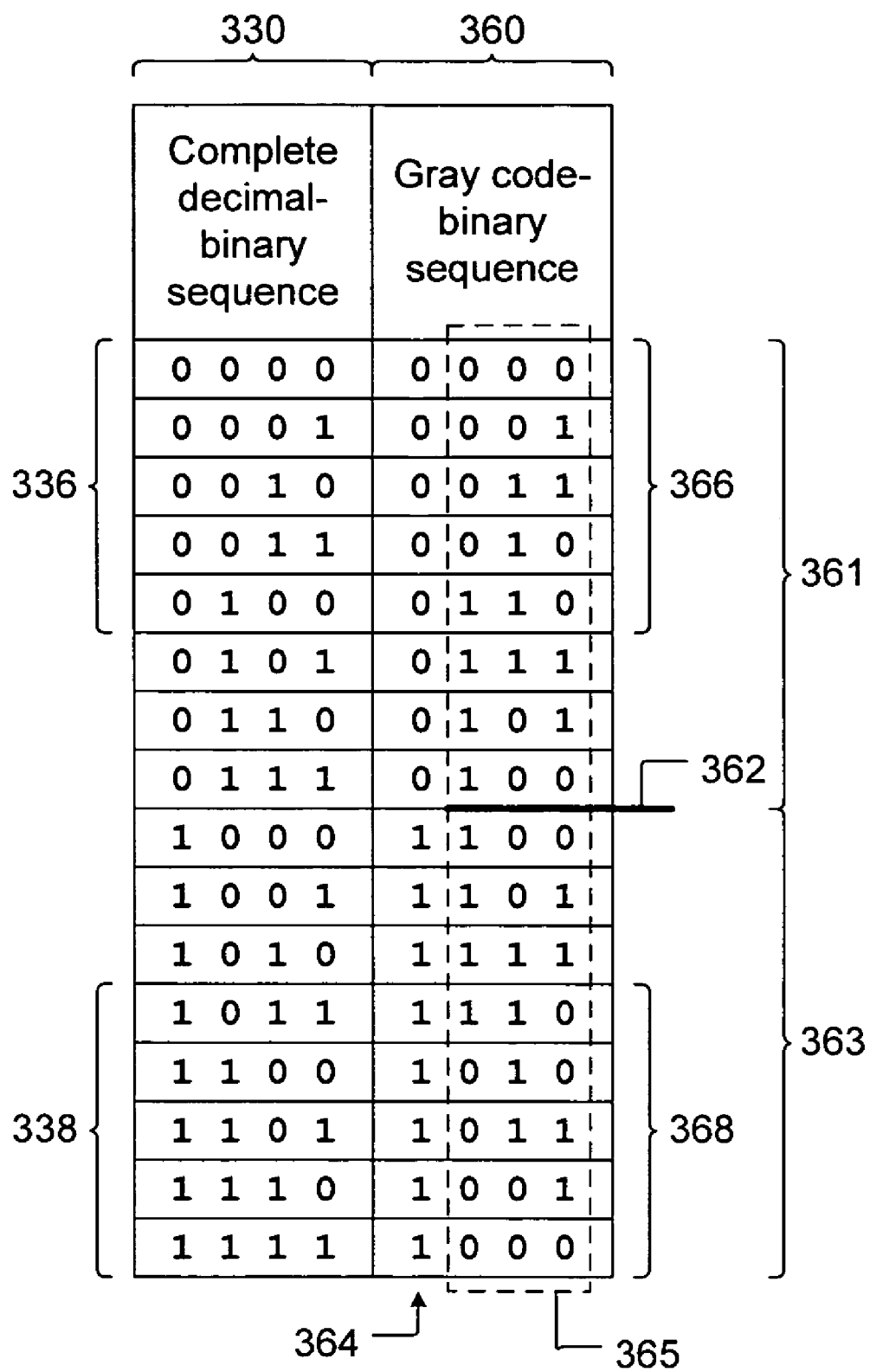

FIG. 4 illustrates the complete-decimal-binary sequence 330 for 4-bit words and the corresponding Gray code sequence 360 listed already as TABLE 1 above. The complete-decimal-binary sequence 330 is also illustrated in FIG. 3A as column 330. Referring to FIGS. 3A and 4, since the intermediate sequence 340 is a subset of the complete-decimal-binary sequence 330, the Gray code sequence 340 for the intermediate sequence 330 is also a subset of the Gray code sequence 360 for the complete-decimal-binary sequence 330. In particular the Gray code sequence 340 for the intermediate sequence 330 is made up of segments 366 and 368 of the Gray code sequence 360 for the complete-decimal-binary sequence 330.

The resulting Gray code sequence 330 still retains the useful property in that any two successive values differ in only one digit. This is because the Gray code sequence 360 (from which the Gray code sequence 330 is derived from) is reflective about its center line 362 (except for its most significant bit 364). This is illustrated in FIG. 4. For the Gray code sequence 360, not considering its most significant bit 364, the second half 363 of the Gray codes are identical to but in a reverse order from the first half 361 of the Gray codes. The Gray code sequence 360 is reflective about its center line 362. This reflective property is known in the art.

Gray Code Sequence to Intermediate Sequence

Referring again to FIGS. 1 and 3A, the Gray code sequence 350 is communicated from the first circuit domain 110 (of FIG. 1) to the second circuit domain 150 (of FIG. 1) where the generalized Gray code de-converter 160 converts the incoming Gray code sequence 350 to the decimal-binary sequence 310 by reversing the operations of the generalized Gray code converter 120.

Figure 5:
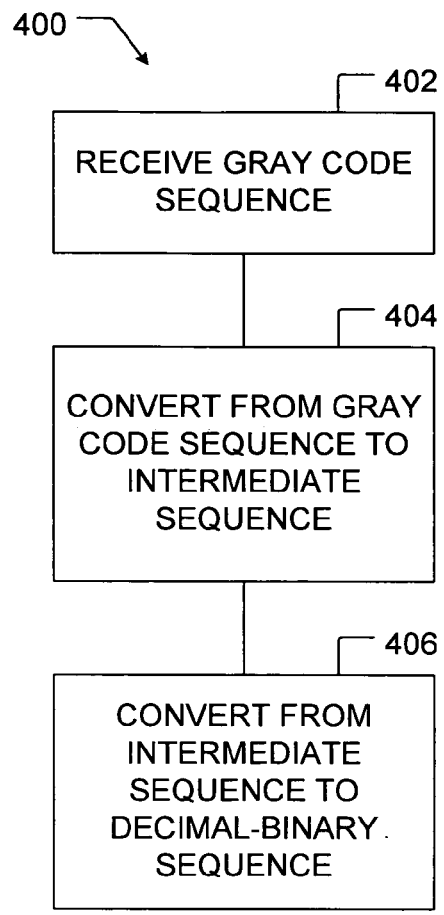
FIG. 5 is a flow chart illustrating another aspect of the present invention.

Operations of the generalized Gray code de-converter 160 can be explained utilizing flowchart 400 of FIG. 5 along with various sequences illustrated in FIG. 3A and discussed above. Referring to FIGS. 3A and 5, the Gray code sequence 350 is received by the generalized Gray code de-converter 160. Step 402. Next, the Gray code sequence 350 is converted to the intermediate sequence 340. Step 404. Then, the intermediate sequence 340 is converted to the decimal-binary sequence 310. Step 406. In short, to convert the Gray code sequence 350 to the decimal-binary sequence 310, the steps outlined in the flowchart 200 of FIG. 2 is performed in a reverse order.

FIG. 3B illustrates various sequences applicable for conversion of the Gray code sequence 350 to the intermediate sequence 340 then to the decimal-binary sequence 310.

Gray Code Sequence to Intermediate Sequence

Referring to FIGS. 1 and 3B, the received Gray code sequence 350 is converted to the intermediate sequence 340 using a known Gray code de-conversion technique.

Intermediate Sequence to Decimal-Binary Sequence

The intermediate sequence 340 is used to form the doubled decimal-binary sequence 320 by reversing the operation (described above) to form the intermediate sequence 340 from the doubled decimal-binary sequence 320. That is, the top half 346 of the intermediate sequence 340 forms the top half 326 of the doubled decimal-binary sequence 320, and a shifted bottom half 348 of the intermediate sequence 340 forms the bottom half 328 of the doubled decimal-binary sequence 320. Here, the shifting is performed by subtracting the shift constant R from the words of the bottom half 348 of the intermediate sequence 340.

Then, the top half 326 of the doubled decimal-binary sequence 320 is mapped to the entire decimal-binary sequence 310. Also, the bottom half 328 of the doubled decimal-binary sequence 320 is mapped to the entire decimal-binary sequence 310. This mapping is performed by removing the most significant bit 322 from the words of the doubled decimal-binary sequence 320.

Hardware and Code—Coding

Figure 6:
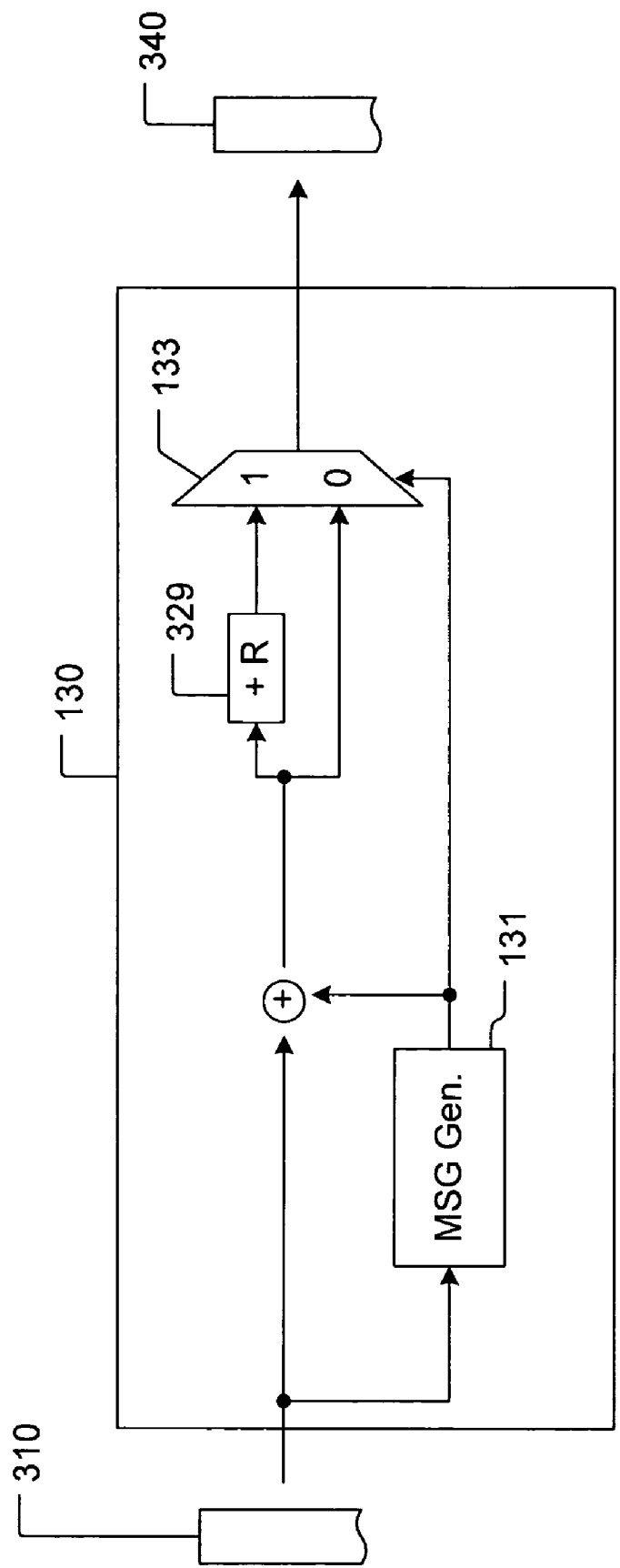

FIG. 6 illustrates one embodiment of the decimal-binary to intermediate-binary converter 130 of FIG. 1 in more detail. Referring to FIGS. 3B and 6, the decimal-binary to intermediate-binary converter 130 takes, as its input, the decimal-binary sequence 310. A most significant bit generator (MSB Gen) 131 examines the input decimal-binary sequence 310 to generate either a "0" or a "1" as the most significant bit 322 to form, combined with the decimal-binary sequence 310, the doubled decimal-binary sequence 320.

The doubled decimal-binary sequence 320 is introduced to an adding circuit 329 and a first input of a multiplexer 133. The adding circuit 329 adds the shift constant R to the doubled decimal-binary sequence 320 and introduces the shifted values to a second input of the multiplexer 133. The multiplexer uses the MSB generated value to select either from the un-shifted sequence of its first input or the shifted sequence of its second input to produce the intermediate sequence 340.

Then, the intermediate sequence 340 is used as an input to the intermediate-binary to Gray code converter 140 to generate the Gray code sequence 350. For the intermediate-binary to Gray code converter 140, any known Gray code generating hardware or software that produces a reflective Gray code can be used. For example, the following is a computer program code in C programming language that generates the Gray code sequence 350 from the intermediate sequence 340:

```
for (bit=0; bit<N-1; ++bit) {
    gray_code [bit] = binary_code[bit] /
        binary_code [bit+1];
}
gray_code[N-1] = binary_code[N-1];
``` where
  N is the number of bits (width) of the words of the intermediate sequence 340;
  bit is an index that references a specific bit (signal) within the word. That is, if a 4-bit word (e.g., 1011) is considered as an array of bits, then bit 3 is 1, bit 2 is 0, bit 1 is 1 and bit 0 is 1;
  binary_code is an array that contains the bits of one word in the intermediate sequence 340; and
  gray_code is an array that contains the bits of one word in the Gray code sequence.

Hardware and Code—deCoding

Also known in the art is the reverse operation of converting the Gray code sequence 350 to the intermediate sequence 340. For this operation, any known hardware or software technique may be used. For example, the following is a computer program code in C programming language that generates the intermediate sequence 340 from the Gray code sequence 350:

```
binary_code[N-1] = gray_code[N-1];
for(bit=N-2; bit>=0; --bit) {
    binary_code[bit] = binary_code [bit+1] ^
        gary_code[bit];
}
``` where
  N is the number of bits (width) of the words of the intermediate sequence 340;
  bit is an index that references a specific bit (signal) within the word. That is, if a 4-bit word (e.g., 1011) is considered as an array of bits, then bit 3 is 1, bit 2 is 0, bit 1 is 1 and bit 0 is 1;
  binary_code is an array that contains the bits of one word in the intermediate sequence 340; and
  gray_code is an array that contains the bits of one word in the Gray code sequence.

Figure 7:
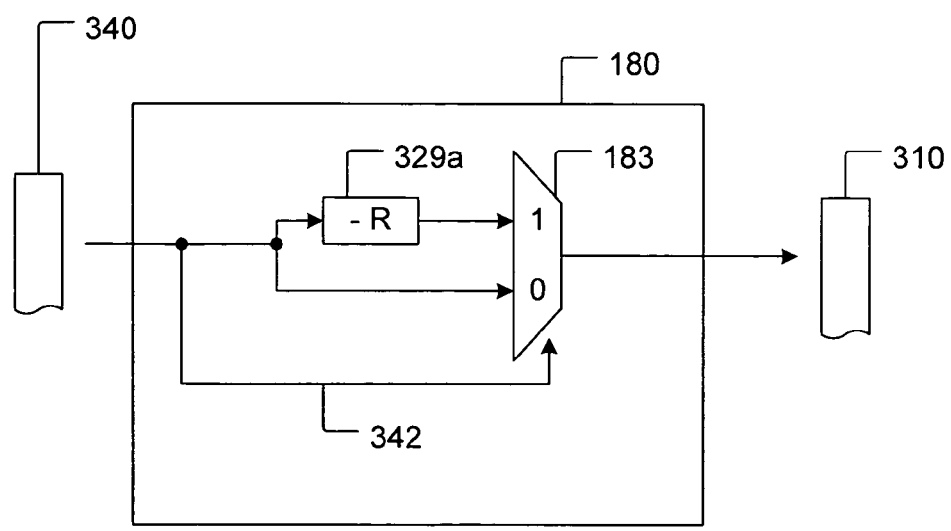
FIGS. 6 and 7 are more detailed illustrations of portions of the communication system of FIG. 1.

The intermediate sequence 340 is then converted to the binary sequence 310. FIG. 7 illustrates one embodiment of the intermediate-binary to decimal-binary converter 180 of FIG. 1 in more detail. Referring to FIGS. 3B and 7, the intermediate-binary to decimal-binary converter 180 takes, as its input, the intermediate binary sequence 340. The intermediate-binary sequence 340 is introduced to a subtracting circuit 329*a* and a first input of a multiplexer 183. The subtracting circuit 329*a* subtracts the shift constant R from the intermediate-binary sequence 340 and introduces the shifted values to a second input of the multiplexer 183. The multiplexer 183 uses the most significant bit (MSB) of the intermediate-binary sequence 340 to select either from the un-shifted sequence of its first input or the shifted sequence of its second input to produce the doubled decimal-binary sequence 320.

Then, the MSB bit 322 of the doubled decimal-binary sequence 320 is eliminated resulting in the decimal-binary sequence 310.

From the foregoing, it will be apparent that the present invention is novel and offers advantages over the current art. Although specific embodiments of the invention are described and illustrated above, the invention is not to be limited to the specific forms or arrangements of parts so described and illustrated. For example, differing configurations, sizes, or materials may be used but still fall within the scope of the present invention. Further, the present invention is disclosed for application to electrical signals; however, the present invention encompasses optical signals and any and all other types of signals in the magneto-electric spectrum. The invention is limited by the claims that follow.

What is claimed is:

1. A generalized Gray code converter comprising:
    a decimal-binary to intermediate-binary converter operable to convert a sequence of sets of electrical signals encoded in decimal-binary format (decimal-binary sequence) to a sequence of sets of electrical signals encoded in intermediate-binary format (intermediate sequence);
    an intermediate-binary to Gray code converter, connected to said decimal-binary to intermediate-binary converter said intermediate-binary to Gray code converter operable to convert the intermediate sequence to a sequence of sets of electrical signals encoded in Gray code-binary format (Gray code sequence); and
    wherein the decimal-binary sequence has a number of states and wherein said decimal-binary to intermediate-binary converter doubles the number of states of the decimal-binary sequence resulting in a doubled decimal-binary sequence.

2. The generalized Gray code converter recited in claim 1 wherein
the decimal-binary sequence includes B sets of signals where B is the number of states of the decimal-binary sequence, and each set of the decimal-binary sequence having n bits, each state of the decimal-binary sequence represented by a set; and
said decimal-binary to intermediate-binary converter maps the doubled decimal-binary sequence to a complete-decimal-binary sequence having base N bits where N is n+1.

3. The generalized Gray code converter recited in claim 2 wherein top half of the doubled decimal-binary sequence is mapped to corresponding top entries of the complete-decimal-binary sequence; and bottom half of the doubled decimal-binary sequence is mapped to corresponding bottom entries of the complete-decimal-binary sequence resulting in the intermediate sequence.

4. The generalized Gray code converter recited in claim 1 wherein said decimal-binary to intermediate-binary converter forms the intermediate sequence by combining a top half of the doubled decimal-binary sequence with a shifted bottom half of the doubled decimal-binary sequence.

5. A generalized Gray code de-converter comprising:
a Gray code to intermediate-binary converter operable to convert a sequence of sets of electrical signals encoded in Gray code binary format (Gray code sequence) to a sequence of sets of electrical signals encoded in intermediate-binary format (intermediate sequence);
an intermediate-binary to decimal-binary converter, connected to said Gray code to intermediate-binary converter, said intermediate-binary to decimal-binary converter operable to convert the intermediate sequence to a sequence of sets of electrical signals encoded in decimal-binary format (decimal-binary sequence); and
wherein the intermediate sequence has a number of states, and wherein said intermediate-binary to decimal-binary converter halves the number of states of the intermediate sequence resulting in the decimal-binary sequence.

6. The generalized Gray code de-converter recited in claim 5 wherein said intermediate-binary to decimal-binary converter maps the intermediate sequence to the decimal-binary sequence.

7. A communication system comprising:
a first circuit domain comprising:
a generalized Gray code converter including:
a decimal-binary to intermediate-binary converter operable to convert a sequence of sets of electrical signals encoded in decimal-binary format (decimal-binary sequence) to a sequence of sets of electrical signals encoded in intermediate-binary format (intermediate sequence);
an intermediate-binary to Gray code converter, connected to said decimal-binary to intermediate-binary converter, said intermediate-binary to Gray code converter operable to convert the intermediate sequence to a sequence of sets of electrical signals encoded in Gray code-binary format (Gray code sequence); and
a register operable to provide a pointer to the decimal-binary sequence in said generalized Gray code converter.

8. The communication system recited in claim 7 further comprising a second circuit domain, said second circuit domain comprising:
a generalized Gray code de-converter including:
a Gray code to intermediate-binary converter operable to convert a sequence of sets of electrical signals encoded in Gray code binary format (Gray code sequence) to a sequence of sets of electrical signals encoded in intermediate-binary format (intermediate sequence); and
an intermediate-binary to decimal-binary converter, connected to said Gray code to intermediate-binary converter, said intermediate-binary to decimal-binary converter operable to convert the intermediate sequence to a sequence of sets of electrical signals encoded in decimal-binary format (decimal-binary sequence).

9. A method for communicating signals, said method comprising:
converting a sequence of sets of signals encoded in decimal-binary format (decimal-binary sequence) into a sequence of sets of signals encoded in intermediate-binary format (intermediate sequence); and
converting the intermediate sequence into a sequence of sets of electrical signals encoded in Gray code-binary format (Gray code sequence);
transmitting the Gray code sequence;
wherein,
the decimal-binary sequence includes B sets of signals where B is the number of states of the decimal-binary sequence, and each set of the decimal-binary sequence having n bits, each state of the decimal-binary sequence represented by a set;
the step of converting the decimal-binary sequence into the intermediate sequence comprises:
doubling the number of states of the decimal-binary sequence resulting in a doubled decimal-binary sequence; and
mapping the doubled decimal-binary sequence to a complete-decimal-binary sequence of base of N bits where N is n+1.

10. The method recited in claim 9 wherein,
top half of the doubled decimal-binary sequence is mapped to top entries of the complete-decimal-binary sequence; and
bottom half of the doubled decimal-binary sequence is mapped to bottom entries of the complete-decimal-binary sequence.

11. The method recited in claim 9 wherein the step of converting the decimal-binary sequence into the intermediate sequence comprises:
doubling the number of states of the decimal-binary sequence resulting in a doubled decimal-binary sequence; and
forming the intermediate sequence with a top half the doubled decimal-binary sequence and shifted bottom half of the doubled decimal-binary sequence.

12. The method recited in claim 11 wherein the bottom half of the doubled decimal-binary sequence is shifted per a calculated shift constant R determined as $$R=(2N-2B)/2$$

where
N is number of bits in a word of the doubled decimal-binary sequence; and
B is the number of states of the decimal-binary sequence.

13. The method recited in claim 9 further comprising:
receiving the Gray code sequence;
converting the Gray code sequence into the intermediate sequence; and
converting the intermediate sequence into the decimal-binary sequence.

14. The method recited in claim 13 wherein the step of converting the intermediate sequence into the decimal-binary sequence comprises:
forming a doubled decimal-binary sequence with a top half of the intermediate sequence and shifted bottom half of the intermediate sequence; and
mapping a top half of the doubled decimal-binary sequence to the entire decimal-binary sequence; and
mapping a bottom half of the doubled decimal-binary sequence to the entire decimal-binary sequence.

15. The method recited in claim 14 wherein the step of the bottom half of the doubled decimal-binary sequence is mapped to the entire decimal-binary sequence by removing the most significant bit of the doubled decimal-binary sequence.

* * * * *

UNITED STATES PATENT AND TRADEMARK OFFICE
CERTIFICATE OF CORRECTION

| | | |
|---|---|---|
| PATENT NO. | : 7,071,855 B1 | Page 1 of 1 |
| APPLICATION NO. | : 11/020997 | |
| DATED | : July 4, 2006 | |
| INVENTOR(S) | : Jonathan B. Sadowsky | |

It is certified that error appears in the above-identified patent and that said Letters Patent is hereby corrected as shown below:

Title page, Col. 2, (Other Publications), Line 5, delete "wilkipedia." and insert -- Wikipedia. --;

Column 10, Line 61, Claim 1, delete "converter" and insert -- converter, --;

Column 12, Line 62, Claim 12, delete "R=(2N-2B)/2" and insert -- $R=(2^N-2B)/2$ --.

Signed and Sealed this

Eighth Day of June, 2010

David J. Kappos
*Director of the United States Patent and Trademark Office*